(12) United States Patent
Nakanishi et al.

(10) Patent No.: US 10,521,724 B2
(45) Date of Patent: Dec. 31, 2019

(54) NUMERICAL CONTROLLER WITH SWARF REMOVAL CALCULATIONS

(71) Applicant: FANUC CORPORATION, Minamitsuru-gun, Yamanashi (JP)

(72) Inventors: Giichi Nakanishi, Yamanashi (JP); Hideaki Maeda, Yamanashi (JP); Yorikazu Fukui, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 412 days.

(21) Appl. No.: 15/496,692

(22) Filed: Apr. 25, 2017

(65) Prior Publication Data
US 2017/0316323 A1    Nov. 2, 2017

(30) Foreign Application Priority Data

Apr. 28, 2016   (JP) .................................. 2016-090842

(51) Int. Cl.
*G06F 19/00* (2018.01)
*G06N 5/04* (2006.01)
*G06F 17/50* (2006.01)

(52) U.S. Cl.
CPC ........... *G06N 5/04* (2013.01); *G06F 17/5009* (2013.01)

(58) Field of Classification Search
CPC ............................. G06N 5/04; G06F 17/5009
See application file for complete search history.

(56) References Cited

U.S. PATENT DOCUMENTS

| 4,956,787 A | 9/1990 | Ito et al. |
| 5,189,624 A * | 2/1993 | Barlow ................ G05B 19/182 |
| | | 700/169 |

(Continued)

FOREIGN PATENT DOCUMENTS

| CN | 103268083 A | 8/2013 |
| JP | S6479805 A | 3/1989 |

(Continued)

OTHER PUBLICATIONS

Kaldos, A., I. F. Dagiloke, and A. Boyle. "Computer aided cutting process parameter selection for high speed milling." Journal of Materials processing technology 61.1-2 (1996): 219-224. (Year: 1996).*

(Continued)

*Primary Examiner* — Michael D Masinick
(74) *Attorney, Agent, or Firm* — RatnerPrestia

(57) ABSTRACT

Provided is a numerical controller that is capable of determining a proper timing of swarf discharge and allows an operator to change a swarf discharge method and examine appropriateness of the timing of the swarf discharge on an as needed basis, the numerical controller including a simulation unit that executes a simulation in which a workpiece is machined based on a machining program, a rendered workpiece volume calculation unit that calculates the volume of a rendered workpiece representing the shape of the workpiece rendered by the simulation, and a swarf accumulation amount prediction unit that predicts, based on the volume of the initial rendered workpiece when execution of the simulation is started and the volume of the rendered workpiece when execution of each block included in the machining program is completed, a swarf accumulation amount when the execution of the block is completed.

5 Claims, 6 Drawing Sheets

(56) References Cited

U.S. PATENT DOCUMENTS

| | | | |
|---|---|---|---|
| 5,428,547 A | 6/1995 | Ikeda | |
| 5,761,068 A | 6/1998 | Nakata | |
| 2003/0152699 A1* | 8/2003 | Someno | C23C 4/16 427/236 |
| 2004/0186612 A1 | 9/2004 | Edwards et al. | |
| 2005/0060941 A1* | 3/2005 | Provow | B24D 3/28 51/293 |
| 2008/0105094 A1* | 5/2008 | McMurtry | B23Q 15/12 82/118 |
| 2013/0260656 A1* | 10/2013 | Seth | B24B 37/26 451/527 |
| 2018/0311777 A1* | 11/2018 | Sugiura | B23B 25/02 |
| 2019/0039198 A1* | 2/2019 | Sugiura | B23Q 11/0075 |

FOREIGN PATENT DOCUMENTS

| | | | |
|---|---|---|---|
| JP | 0519829 A | 1/1993 | |
| JP | H096424 A | 1/1997 | |
| JP | H 09-73309 A | 3/1997 | |
| JP | 2003-291033 A | 10/2003 | |
| JP | 2010134776 A | 6/2010 | |
| JP | 2012213837 A | 11/2012 | |
| JP | 2014-213434 A | 11/2014 | |

OTHER PUBLICATIONS

Kappmeyer, Gregor, et al. "Modern machining of advanced aerospace alloys-Enabler for quality and performance." Procedia CIRP 1 (2012): 28-43. (Year: 2012).*

Notification of Reasons for Refusal for Japanese Application No. 2016-090842, dated May 29, 2018, with translation, 13 pages.

Chinese Office Action for Chinese Application No. 201710287173.X, dated Jul. 19, 2019, with translation, 15 pages.

* cited by examiner

FIG. 3
| BLOCK NUMBER | PROGRAM |
|---|---|
| | ... |
| 15 | G1 Z-20. ; |
| 16 | X150. ; |
| 17 | Y200. ; |
| 18 | X0. ; |
| 19 | Y5. ; |
| 20 | M500 ; |
| 21 | X145. ; |
| 22 | Y190. ; |
| 23 | X5. ; |
| 24 | Y10. ; |
| 25 | X140. ; |
| 26 | M500 ; |
| 27 | Y180. ; |
- AUTOMATICALLY INSERTED M CODE FOR SWARF DISCHARGE (block 20)
- BLOCK IN WHICH SWARF ACCUMULATION AMOUNT EXCEEDS THRESHOLD VALUE (block 21)
- AUTOMATICALLY INSERTED M CODE FOR SWARF DISCHARGE (block 26)
- BLOCK IN WHICH SWARF ACCUMULATION AMOUNT EXCEEDS THRESHOLD VALUE (block 27)
FIG. 4
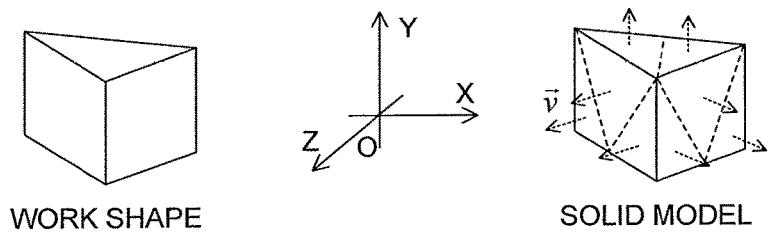
WORK SHAPE      SOLID MODEL
FIG. 5
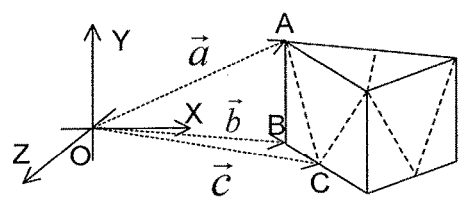

NUMERICAL CONTROLLER WITH SWARF REMOVAL CALCULATIONS

BACKGROUND OF THE INVENTION

1. Field of the Invention

The present invention relates to a numerical controller, and particularly relates to a numerical controller that determines a swarf accumulation amount.

2. Description of the Related Art

In a machine tool, swarf is sometimes produced during machining of a workpiece and accumulates, and there are cases where the swarf enters into a mechanical portion of the machine tool and the mechanical portion of the machine tool thereby breaks down or the machining is thereby negatively influenced by the swarf directly. In order to prevent the breakdown of the mechanical portion of the machine tool or the negative influence on the machining caused by the entry of the swarf, it is necessary to discharge the swarf having accumulated in the machine tool.

One of means for discharging the swarf is means for jetting a cutting fluid from a nozzle mounted to the inside of a cover that covers the machine tool to thereby wash away the swarf that adheres to an internal portion of the cover and accumulates. In the case where a washing method of the internal portion of the cover using the above means is used, it is common to start the jetting of the cutting fluid at the beginning of a machining program and stop the jetting thereof at the end of the machining program.

In the method described above, once the jetting of the cutting fluid is started, the cutting fluid is caused to flow at all times, and hence a problem arises in that the cutting fluid is caused to flow wastefully especially in machining that produces a small amount of the swarf, and the cutting fluid and electric power are wasted. For the purpose of solving such a problem, Japanese Patent Application Laid-open No. 2014-213434 discloses a conventional art in which a cutting volume is predicted by a formula formulated according to the type of a tool used in machining and, when the cutting volume exceeds a given threshold value, the cutting fluid is jetted and the swarf is washed away.

However, the conventional art disclosed in Japanese Patent Application Laid-open No. 2014-213434 has a problem that information required to predict the cutting volume is different from actual information, and hence accuracy in the prediction of a timing at which the cutting volume exceeds the threshold value is low. For example, in the conventional art disclosed in Japanese Patent Application Laid-open No. 2014-213434, the cutting volume is predicted by using a value obtained by multiplying a tool diameter by a constant of 0 to 1 as a cutting depth, but the value of the cutting depth varies according to the material of a workpiece and machining accuracy in actual machining. In addition, in the conventional art disclosed in Japanese Patent Application Laid-open No. 2014-213434, the swarf is produced in an air-cut portion in the calculation, but the swarf is not produced in the air-cut portion in the actual machining. With such differences between the prediction and the actual machining, in the case where the conventional art disclosed in Japanese Patent Application Laid-open No. 2014-213434 is used, it is not possible to jet the cutting fluid at a proper timing, wasteful jetting of the cutting fluid is performed in the case where the timing of jetting of the cutting fluid is early, and the swarf accumulates and the possibility of occurrence of a machining defect is increased in the case where the timing of jetting of the cutting fluid is late.

In addition, in the conventional art, the timing of jetting of the cutting fluid is controlled according to a machining status, but a pressure applied to the cutting fluid and an area to which the cutting fluid is jetted are fixed, and hence a problem arises in that it is not possible to handle the case, for example, where the pressure when the cutting fluid is jetted is not proper and a force for washing the swarf away is insufficient and where the cutting fluid is not jetted to a proper area, depending on the accumulation status of the swarf.

Further, in the conventional art, control in which the cutting fluid is jetted at the timing at which the predicted cutting volume exceeds the threshold value is directly performed, and hence a problem arises in which it is difficult for an operator to determine whether or not the timing of jetting of the cutting fluid is appropriate.

SUMMARY OF THE INVENTION

To cope with this, an object of the present invention is to provide a numerical controller that is capable of determining a proper timing of swarf discharge and allows an operator to change a swarf discharge method and examine appropriateness of the timing of the swarf discharge on an as needed basis.

In the present invention, a three-dimensional machining simulation using solid data based on a machining program is executed and, as shown in FIG. 1, the volume of a rendered workpiece when execution of the machining program is started and the volume of the rendered workpiece in a block during execution of each block are determined. Subsequently, as shown in FIG. 2, a swarf accumulation amount is calculated based on a difference between these volumes, and a function of automatically inserting a program such as an M code for swarf discharge shown in FIG. 3 into a block immediately before the swarf accumulation amount exceeds a preset threshold value is provided in the numerical controller, whereby the above problems are solved.

A numerical controller according to the present invention is a numerical controller including a simulation unit that executes a simulation in which a workpiece is machined based on a machining program, the numerical controller including a rendered workpiece volume calculation unit that calculates a volume of a rendered workpiece representing a shape of the workpiece that is rendered by the simulation, and a swarf accumulation amount prediction unit that predicts, based on the volume of an initial rendered workpiece when execution of the simulation is started and the volume of the rendered workpiece when execution of each block included in the machining program is completed that are calculated by the rendered workpiece volume calculation unit, a swarf accumulation amount when the execution of the block is completed.

The numerical controller according to the present invention further includes a swarf discharge timing calculation unit that calculates a timing at which swarf is discharged based on the swarf accumulation amount when the execution of each block included in the machining program is completed that is predicted by the swarf accumulation amount prediction unit.

The numerical controller according to the present invention further includes a coefficient database that stores a coefficient that is used when the swarf accumulation amount is calculated from a difference between the volume of the initial rendered workpiece when the execution of the simulation is started and the volume of the rendered workpiece when the execution of the block included in the machining program is completed, and the swarf accumulation amount prediction unit predicts the swarf accumulation amount by multiplying, by the coefficient, the difference between the volume of the initial rendered workpiece when the execution of the simulation is started and the volume of the rendered workpiece when the execution of the block included in the machining program is completed.

In the numerical controller according to the present invention, at least one of a workpiece material coefficient associated with a material of the workpiece and a tool type coefficient associated with a type of a tool used in the machining is stored in the coefficient database.

The numerical controller according to the present invention further includes a display unit that displays the timing at which the swarf is discharged that is calculated by the swarf discharge timing calculation unit.

In the numerical controller according to the present invention, the display unit displays, in association with each block of the machining program, the swarf accumulation amount when execution of the block is completed.

The numerical controller according to the present invention further includes a swarf discharge command insertion unit that inserts a command code for swarf discharge into the machining program based on the timing at which the swarf is discharged that is calculated by the swarf discharge timing calculation unit. According to the present invention, it becomes possible to predict the swarf accumulation amount with high accuracy based on the volume of a portion that is removed from the workpiece by cutting or the like before a currently executed block, and accurately detect the position of the block that requires a swarf discharge operation. In addition, the M code for swarf discharge or the like is inserted into the block immediately before the position of the block that requires the swarf discharge operation, and hence it becomes possible for the operator to reedit the code to thereby change the pressure applied to the cutting fluid and the area to which the cutting fluid is jetted, and examine the appropriateness of the timing of jetting of the cutting fluid, and it is possible to reduce time and effort required to create the program by the operator.

BRIEF DESCRIPTION OF THE DRAWINGS

The above and other objects and novel features of the present invention will become apparent from the following description of preferred embodiments given in conjunction with the accompanying drawings, in which:

FIG. 3 is a view showing an example in which a command code for swarf discharge is automatically inserted into the machining program according to the present invention;

FIG. 4 is a view illustrating a model in which the surface of a workpiece is constituted by a plurality of triangular elements;

FIG. 5 is a view explaining a calculation method of the volume of the workpiece according to an embodiment of the present invention;

DETAILED DESCRIPTION OF THE PREFERRED EMBODIMENTS

Figure 1:
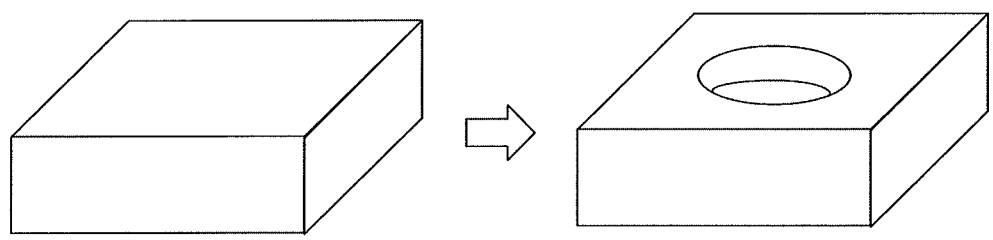
FIG. 1 is a view showing an example in which the volume of a rendered workpiece when execution of a machining program is started and the volume of the rendered workpiece in a block during execution of each block are determined according to the present invention.

Hereinbelow, an embodiment of the present invention will be described together with the drawings.

A numerical controller of the present invention performs prediction of a swarf accumulation amount based on a machining program and automation insertion of a code for swarf discharge into the machining program by using the following individual means.

<Swarf Accumulation Amount Prediction Unit>

The numerical controller of the present invention calculates the volume of an initial rendered workpiece when machining based on the machining program is started by a three-dimensional machining simulation that uses solid data, and also calculates, every time one block of the machining program is executed, the volume of the rendered workpiece after the execution of the block during the machining simulation. Note that a calculation method of the volume of the rendered workpiece by the three-dimensional machining simulation that uses the solid data will be described later.

Subsequently, a difference between the calculated volume of the initial rendered workpiece and the calculated volume of the rendered workpiece after the execution of each block of the machining program is determined, the swarf accumulation amount is calculated from the difference between the volumes, and an execution block number when the swarf accumulation amount exceeds a preset threshold value Th is determined. Note that a method for calculating the swarf accumulation amount from the difference between the volumes will be described later.

Further, the position of a tool when the swarf accumulation amount exceeds the threshold value Th during execution of the block in which the threshold value Th is exceeded is predicted according to the following procedures.

Procedure a) A swarf accumulation amount $V_p$ immediately before the execution of the block in which the threshold value Th is exceeded is determined.

Procedure b) A swarf accumulation amount $V_n$ immediately after the execution of the block in which the threshold value Th is exceeded is determined.

Procedure c) A difference $V_d$ between $V_p$ and $V_n$ is determined. $V_d$ denotes a swarf production amount during the execution of the block.

Procedure d) A difference Vc between the threshold value Th and Vp is determined. Vc denotes the swarf production amount in the block when the threshold value Th is exceeded.

Procedure e) Vc/Vd is determined.

Procedure f) In the case where a command in the block in which the threshold value Th is exceeded is a linear interpolation command, a movement amount of each axis in the block is multiplied by Vc/Vd, and the movement amount of each axis is added to the start position of the block. This is determined to be the position of the tool during the execution of the block in which the threshold value Th is exceeded. In the case where the command in the block in which the threshold value Th is exceeded is a circular interpolation command, a rotation angle when the threshold value Th is exceeded is determined by multiplying the rotation angle in the block by Vc/Vd, and the position of the tool during the execution of the block in which the threshold value Th is exceeded is determined using the rotation angle, a radius, and the start position of the block.

The block number of the block in which the threshold value Th is exceeded and the position of the tool determined by the above procedures are displayed on a display screen of the numerical controller for an operator, and are stored in a memory to which peripheral equipment can refer. Hereinafter, the volume of the rendered workpiece immediately before the start of the block in which the threshold value Th is exceeded is regarded as the volume of the initial rendered workpiece and, by repeating the above method with the block used as a start block, all of the blocks of the machining program in which the threshold value Th of the swarf accumulation amount is exceeded and all of the positions of the tool are extracted.

When the block number of the block in which the threshold value Th is exceeded and the position of the tool are determined, swarf discharge command insertion means described later automatically inserts a command block for swarf discharge into the machining program immediately before the block number when the swarf accumulation amount exceeds the threshold value Th. With this, during the operation of the program into which the command block for swarf discharge is automatically inserted, an operation for swarf removal by the peripheral equipment is started at a timing at which the command block is executed. Herein, the peripheral equipment refers to the memory in which the position of the tool when the swarf accumulation amount exceeds the threshold value Th is stored, whereby it is also possible to cause the peripheral equipment to start the swarf removal operation when the tool moves to the positon of the tool.

Note that the command block for swarf discharge may also be inserted after the operator edits the block when the threshold value Th is exceeded. Since the block number of the block in which the threshold value Th is exceeded and the position of the tool are displayed on the display screen of the numerical controller, the operator can edit the block in which the swarf accumulation amount exceeds the threshold value Th and divide the block at the timing at which the threshold value Th is exceeded. Subsequently, by performing the insertion such that the command block for swarf discharge is executed at the timing after the block is divided, it is possible to perform the swarf removal by an arbitrary method at the high-accuracy timing. For example, it is also possible to suspend the operation at the timing at which the threshold value Th is exceeded, replace the tool with a tool for cleaning, and perform the swarf removal.

<Swarf Discharge Command Insertion Unit>

The numerical controller of the present invention automatically inserts the block of the command code for swarf discharge into the machining program immediately before the block in which the swarf accumulation amount exceeds the threshold value Th. By using this method, it becomes possible to choose various discharge methods only by changing the block of the command code for swarf discharge to be automatically inserted into the machining program, and it is possible to arbitrarily change a pressure applied to a cutting fluid when the swarf is discharged and an area on which a force for the swarf discharge is exerted.

For example, by inserting the block that includes the command codes that perform the following two operations as the command codes for swarf discharge, it becomes possible to discharge the swarf that has accumulated with a proper pressure.

Block 1: a command code for replacing the tool with a tool for cleaning capable of jetting the cutting fluid with a designated pressure Block 2: a cycle command code for swarf washing by the tool obtained by the replacement Note that a user can easily check the timing of the swarf discharge from the command code for swarf discharge in the machining program and the like. In addition, the relationship between the swarf accumulation amount and the block number is realized by plotting and displaying the relationship between the swarf accumulation amount in each block of the machining program predicted by the swarf accumulation amount prediction means and the block number, and hence it becomes possible to judge appropriateness of the insertion position of the block of the command code for swarf discharge into the machining program.

<With Regard to Calculation Method of Volume of Rendered Workpiece>

In the numerical controller of the present invention, the calculation of a volume V of the rendered workpiece is performed by applying the calculation method of the volume based on three-dimensional solid data that is already known to the rendered workpiece. In the calculation of the volume V of the rendered workpiece, the calculation method to be used differs depending on the type of the solid data. Herein, procedures for determining the volume of the rendered workpiece constituted by the solid data of the type that satisfies the following conditions will be described as an example.

Condition 1: The surface of the workpiece is constituted by a plurality of triangular elements as shown in FIG. 4. The shape of the triangle is usually minute, but FIG. 4 shows the triangle that is not minute to facilitate understanding.

Condition 2: Information on a normal vector v of each triangle is available. Note that it is assumed that the direction of the normal vector v is oriented to the outer side of the workpiece as shown in FIG. 4.

First, a volume Vq of a tetrahedron created by using the origin O and vertexes A, B, and C of a given triangle is calculated. The volume Vq of the tetrahedron OABC can be calculated by the following Expression 1. As shown in FIG. 5, vectors a, b, and c in Expression 1 correspond to a vector from the origin O to the vertex A of the triangle, a vector from the origin O to the vertex B of the triangle, and a vector from the origin O to the vertex C of the triangle, respectively.

$$Vq = \frac{1}{6} \times |(\vec{a} \times \vec{b}) \cdot \vec{c}| \qquad \text{[Expression 1]}$$

Next, by using the following Expression 2, an angle Ac formed by the normal vector v of the triangle that is selected when the volume Vq of the tetrahedron OABC is determined and the vector a.

$$Ac = \arccos\left(\frac{\vec{a} \bullet \vec{v}}{|\vec{a}||\vec{v}|}\right) \quad (0° \leq Ac \leq 180°) \quad \text{[Expression 2]}$$

In the case where the angle Ac determined by using Expression 2 is equal or more than 90°, the volume Vq determined by Expression 1 is multiplied by a coefficient−1. By performing the same arithmetic calculation on all triangular elements that constitute the surface of the workpiece and totalizing the volume values of all of the tetrahedrons obtained as the result of the arithmetic calculation, it is possible to determine the volume of the solid model.

<With Regard to Calculation Method of Swarf Accumulation Amount>

In the numerical controller of the present invention, the swarf accumulation amount is calculated by multiplying a value obtained by subtracting the volume of the rendered workpiece when the execution of the currently executed block is completed from the volume of the initial rendered workpiece before machining is started by a proper coefficient. When the coefficient is determined, consideration is given to (1) the material of the workpiece and (2) the type of the tool that significantly influence the swarf accumulation amount. The coefficient is an arbitrary constant or variable. Herein, procedures for calculating the swarf accumulation amount by multiplying the above value by a constant preset according to the material of the workpiece and the type of the tool will be described as an example.

First, a coefficient database used when the swarf accumulation amount is determined based on the value obtained by subtracting the volume of the rendered workpiece the execution of the currently executed block is completed from the volume of the initial rendered workpiece before the machining is started is created in advance. The coefficients stored in the coefficient database include the coefficient that is determined for each workpiece material and the coefficient that is determined for each tool type, and the database is created by setting the above coefficients on a parameter setting screen. The individual coefficients are preferably pre-determined for each workpiece material and for each tool type by a test or the like, and are preferably stored in the coefficient database in association with the workpiece material and a tool type number.

When the machining program is created by the operator, the numerical controller urges the operator to select the material of the workpiece. The operator selects the proper type of the material according to an instruction from the numerical controller. In addition, the operator specifies the tool type number. The type of the used tool changes when tool replacement is performed during the execution of the program, and hence the tool type is specified by, e.g., inserting the tool type into the machining program as a tool replacement command code.

Subsequently, the numerical controller determines a swarf accumulation amount Va during the execution of the machining simulation. The swarf accumulation amount Va can be calculated by using Expression 3 shown below. Note that, in Expression 3, Kw is a coefficient that is predetermined for each workpiece material, Kt is a coefficient that is predetermined for each tool type, and Vm is a value obtained by subtracting the volume of the rendered workpiece when the execution of the currently executed block is completed from the volume of the initial rendered workpiece.

$$Va = Kw \times Kt \times Vm \quad \text{[Expression 3]}$$

In the following description, the configuration of the numerical controller that performs the prediction of the swarf accumulation amount and the insertion of the command code for swarf discharge by using the individual means described above will be described.

Figure 6:
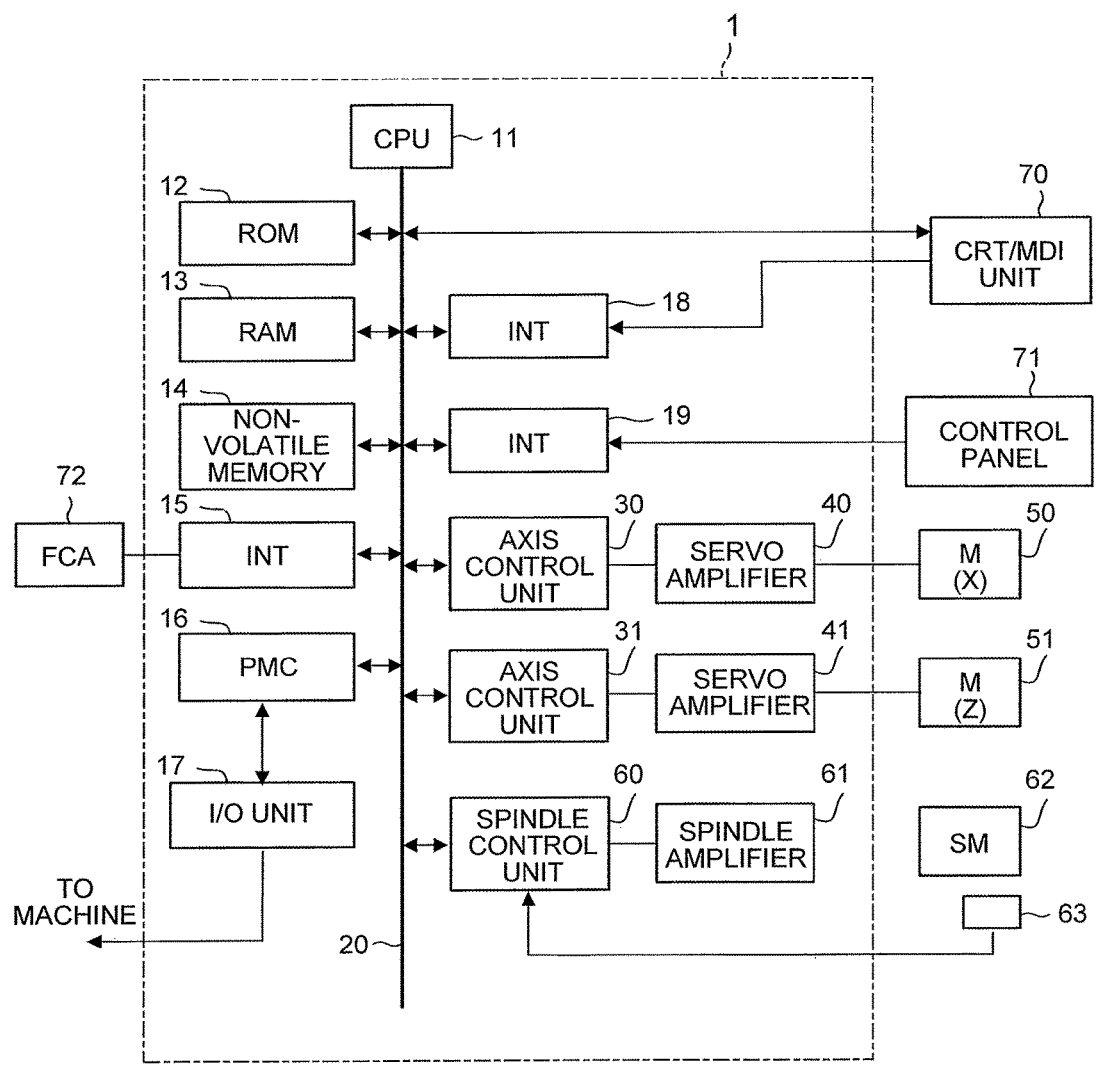
FIG. 6 is a hardware configuration diagram showing principal portions of a numerical controller according to the embodiment of the present invention and a machine tool such as, e.g., a lathe that is driven and controlled by the numerical controller.

FIG. 6 is a hardware configuration diagram showing principal portions of a numerical controller according to an embodiment of the present invention and a machine tool such as, e.g., a lathe that is driven and controlled by the numerical controller. A CPU 11 of a numerical controller 1 is a processor that controls the entire numerical controller 1. The CPU 11 reads a system program stored in a ROM 12 via a bus 20, and controls the entire numerical controller 1 according to the system program. In a RAM 13, temporary calculation data and display data, and various pieces of data input by the operator via a CRT/MDI unit 70 are stored.

A non-volatile memory 14 is configured as a memory in which a storage state is retained even when the numerical controller 1 is turned off by, for example, backing up the storage state using a battery that is not shown. In the non-volatile memory 14, the machining program described later that is read via an interface 15 and the machining program that is input via the CRT/MDI unit 70 are stored. In the non-volatile memory 14, for example, a machining program operation process program that is used for operating the machining program and a graphics rendering process program for the three-dimensional machining simulation are further stored, and these programs are loaded into the RAM 13 when the programs are executed. In addition, into the ROM 12, various system programs for executing a process of an edit mode that is required for creation and edit of the machining program and a display attribute change process of information display related to an axis at the time of detection of the prediction of occurrence of interference are written in advance. Various machining programs such as the machining program that executes the present invention can be input via the interface 15 or the CRT/MDI unit 70 and stored in the non-volatile memory 14.

The interface 15 is the interface for connecting the numerical controller 1 and external equipment 72 such as an adaptor. The machining program and various parameters are read from the side of the external equipment 72. In addition, it is possible to cause external storage means to store the machining program edited in the numerical controller 1 via the external equipment 72. A programmable machine controller (PMC) 16 performs control by outputting a signal to an auxiliary device (e.g., an actuator such as a robot hand for tool replacement) of the machine tool via an I/O unit 17 with a sequence program installed in the numerical controller 1. In addition, the PMC 16 receives signals of various switches in a control panel provided in a main body of the machine tool, and passes the signals to the CPU 11 after performing required signal processing on the signals.

The CRT/MDI unit 70 is a manual data input device that includes a display and a keyboard, and an interface 18 receives commands and data from the keyboard of the CRT/MDI unit 70 and passes them to the CPU 11. An interface 19 is connected to a control panel 71 that includes a manual pulse generator and the like.

Axis control units 30 and 31 of the individual axes receive movement command amounts of the individual axes from the CPU 11, and output the commands for the individual axes to servo amplifiers 40 and 41. The servo amplifiers 40 and 41 receive the commands and drive servo motors 50 and 51 of the individual axes. The servo motors 50 and 51 of the individual axes include position/speed detectors, feed back position/speed signals from the position/speed detectors to the axis control units 30 and 31 to thereby perform feedback control of the position and the speed. Note that, in the block diagram, the feedback of the position and the speed is omitted.

A spindle control unit 60 receives a main axis rotation command to the machine tool, and outputs a spindle speed signal to a, spindle amplifier 61. The spindle amplifier 61 receives the spindle speed signal, causes a main axis motor 62 of the machine tool to rotate at a designated rotation speed, and drives the tool.

A position coder 63 is coupled to the main axis motor 62 using a gear, a belt or the like, the position coder 63 outputs a feedback pulse in synchronization with the rotation of the main spindle, and the feedback pulse is read by the CPU 11.

Figure 2:
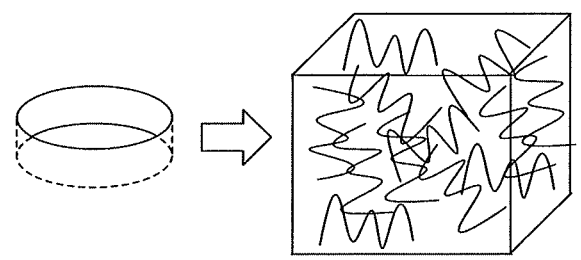
FIG. 2 is a view showing an example in which a swarf accumulation amount is determined from a difference between the volume of the rendered workpiece when the execution of the machining program is started and the volume of the rendered workpiece in the block during the execution of each block according to the present invention.
Figure 7:
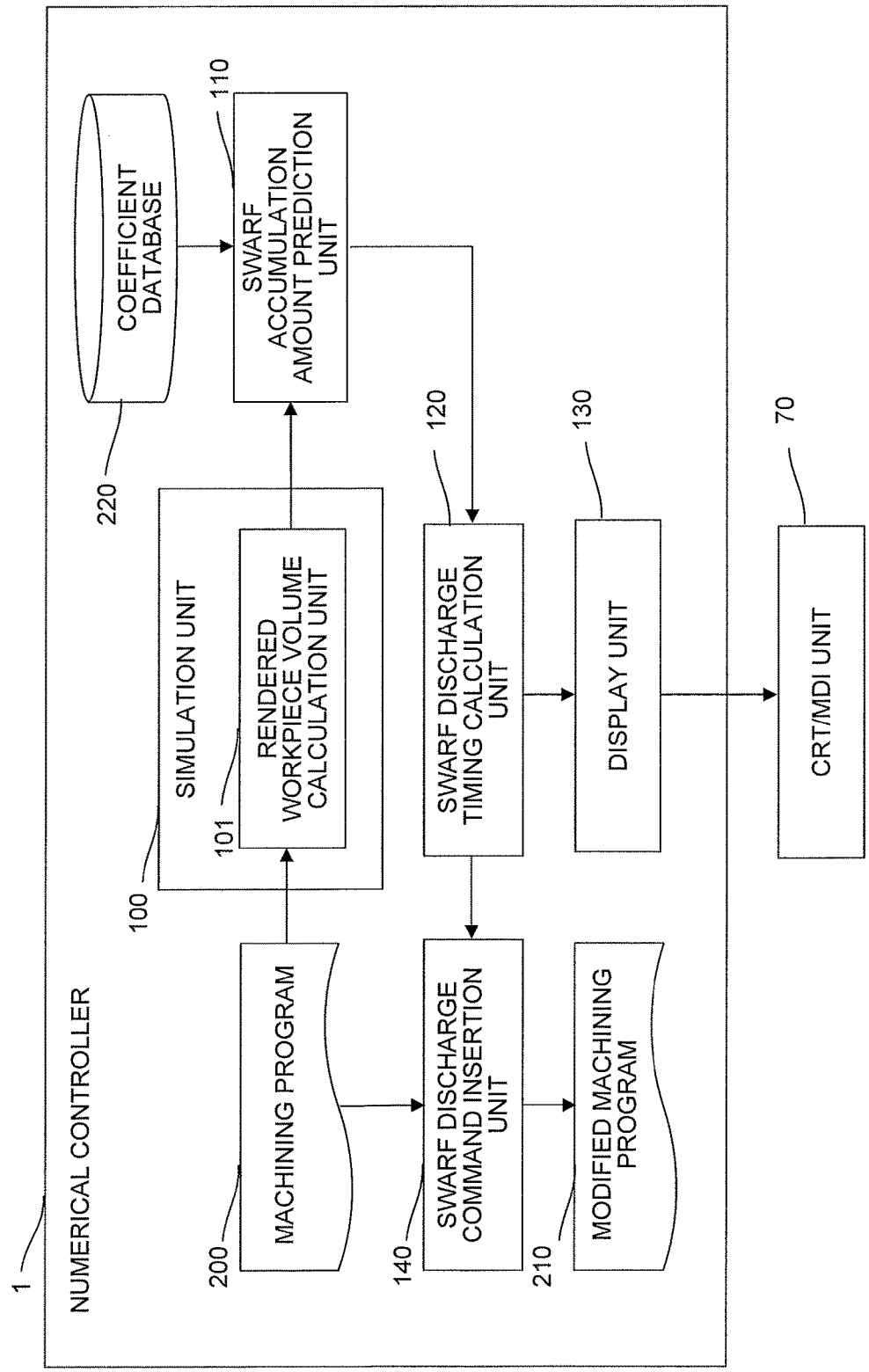
FIG. 7 is a schematic functional block diagram showing functions of the principal portion of the numerical controller according to the embodiment of the present invention.

FIG. 7 is a schematic functional block diagram in the case where the above-described individual means are provided in the numerical controller 1 shown in FIG. 2 as system programs. The numerical controller 1 of the present embodiment includes a simulation unit 100, a swarf accumulation amount prediction unit 110, a swarf discharge timing calculation unit 120, a display unit 130, and a swarf discharge command insertion unit 140.

The simulation unit 100 performs a simulation of machining to a virtual workpiece based on a machining program 200. In the machining simulation executed by the simulation unit 100, it is possible to use a known method disclosed in, e.g., Japanese Patent Application Laid-open No. 2003-291033 or Japanese Patent Application Laid-open No. H09-073309. The simulation unit 100 includes a rendered workpiece volume calculation unit 101, and the rendered workpiece volume calculation unit 101 calculates the volume of the initial workpiece when the machining simulation is started and the volume of the rendered workpiece when the execution of each block of the machining program 200 is completed during the execution of the machining simulation of each block of the machining program 200 by using, e.g., the above-described calculation method of the volume of the rendered workpiece.

The swarf accumulation amount prediction unit 110 predicts the swarf accumulation amount when the execution of each block of the machining program 200 is completed by using the above-described calculation method of the swarf accumulation amount based on the volume of the initial workpiece and the volume of the rendered workpiece when the execution of each block is completed that are calculated in the rendered workpiece volume calculation unit 101.

The swarf discharge timing calculation unit 120 compares the swarf accumulation amount when the execution of each block of the machining program 200 is completed that is predicted by the swarf accumulation amount prediction unit 110 with the threshold value Th pre-stored in a memory that is not shown, and determines the block number of the block in which the swarf accumulation amount exceeds the threshold value Th and the position of the tool when the swarf accumulation amount exceeds the threshold value Th in the block based on the comparison result. As a method for determining the block number of the block in which the swarf accumulation amount exceeds the threshold value Th and the position of the tool when the swarf accumulation amount exceeds the threshold value Th in the block, the above-described method may be used. After the swarf discharge timing calculation unit 120 calculates the timing at which the swarf accumulation amount exceeds the threshold value Th first, the swarf discharge timing calculation unit 120 regards the volume of the rendered workpiece immediately before the block is started as the volume of the initial rendered workpiece and, by repeating the above-described method with the block used as the start block, the swarf discharge timing calculation unit 120 extracts all of the blocks of the machining program in which the swarf accumulation amount exceeds the threshold value Th and all of the positions of the tool.

The display unit 130 displays the timing of the swarf discharge calculated by the swarf discharge timing calculation unit 120 (the block number of the block in which the swarf accumulation amount exceeds the threshold value Th and the position of the tool when the swarf accumulation amount exceeds the threshold value Th in the block) in the CRT/MDI unit 70 such that the operator can view them.

The swarf discharge command insertion unit 140 generates a modified machining program 210 in which the command code for swarf discharge is automatically inserted into the machining program 200 based on the timing of the swarf discharge calculated by the swarf discharge timing calculation unit 120 (the block number of the block in which the swarf accumulation amount exceeds the threshold value Th and the position of the tool when the swarf accumulation amount exceeds the threshold value Th in the block), and outputs the modified machining program 210. It is possible to freely view and edit the modified machining program 210 by operating the CRT/MDI unit 70 by the operator.

Figure 8:
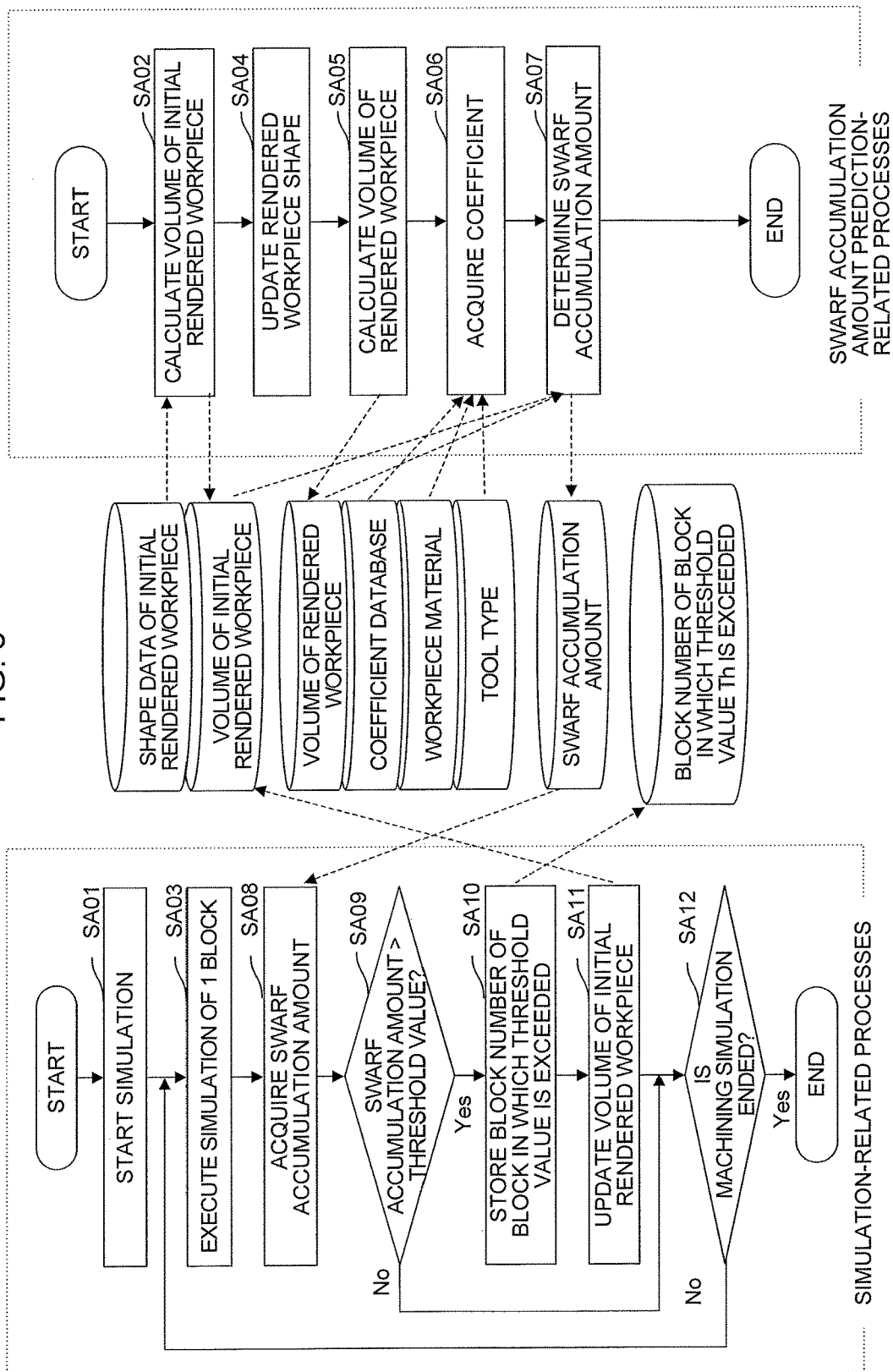
FIG. 8 is a flowchart that divides processes executed on the numerical controller of the present invention into processes related to a machining simulation and processes related to prediction of the swarf accumulation amount and shows them.

FIG. 8 is a flowchart that divides processes executed on the numerical controller 1 of the present invention into processes related to the machining simulation and processes related to the prediction of the swarf accumulation amount and shows them.

[Step SA01] The simulation unit 100 starts the machining simulation.

[Step SA02] The rendered workpiece volume calculation unit 101 calculates the volume of the initial workpiece based on shape data of the initial workpiece.

[Step SA03] The simulation unit 100 executes the machining of one block of the machining program 200 by the simulation.

[Step SA04] The simulation unit 100 updates a workpiece shape by removing a machined portion based on the result of the machining by the simulation.

[Step SA05] The rendered workpiece volume calculation unit 101 calculates the volume of the workpiece based on the workpiece shape updated in Step SA04.

[Step SA06] The swarf accumulation amount prediction unit 110 refers to the coefficient database 220 by using the workpiece material and the tool type input by the operator in advance, and acquires the coefficient used for determining the swarf accumulation amount.

[Step SA07] The swarf accumulation amount prediction unit 110 calculates the predicted value of the swarf accumulation amount based on the coefficient acquired in Step SA06, the volume of the initial workpiece, and the volume of the current workpiece.

[Step SA08] The swarf discharge timing calculation unit 120 acquires the swarf accumulation amount calculated in Step SA07.

[Step SA09] The swarf discharge timing calculation unit 120 determines whether or not the swarf accumulation amount acquired in Step SA08 exceeds the preset threshold value Th. The process flow moves to Step SA10 in the case where the swarf accumulation amount exceeds the threshold value Th, and the process flow moves to Step SA12 in the case where the swarf accumulation amount does not exceed the threshold value Th.

[Step SA10] The swarf discharge timing calculation unit 120 stores the block number of the block of the machining program 200, the simulation of which is currently executed, in the memory. The swarf discharge timing calculation unit 120 calculates the position of the tool when the threshold value Th is exceeded on an as needed basis, and stores the position thereof in the memory similarly.

[Step SA11] The swarf discharge timing calculation unit 120 updates the volume of the initial rendered workpiece with the volume of the current rendered workpiece.

[Step SA12] The simulation unit 100 determines whether or not the machining simulation of each of the blocks of the machining program 200 is ended. The present processes are ended in the case where the machining simulation is ended, and the process flow moves to Step SA03 in the case where the machining simulation is not ended.

Figure 9:
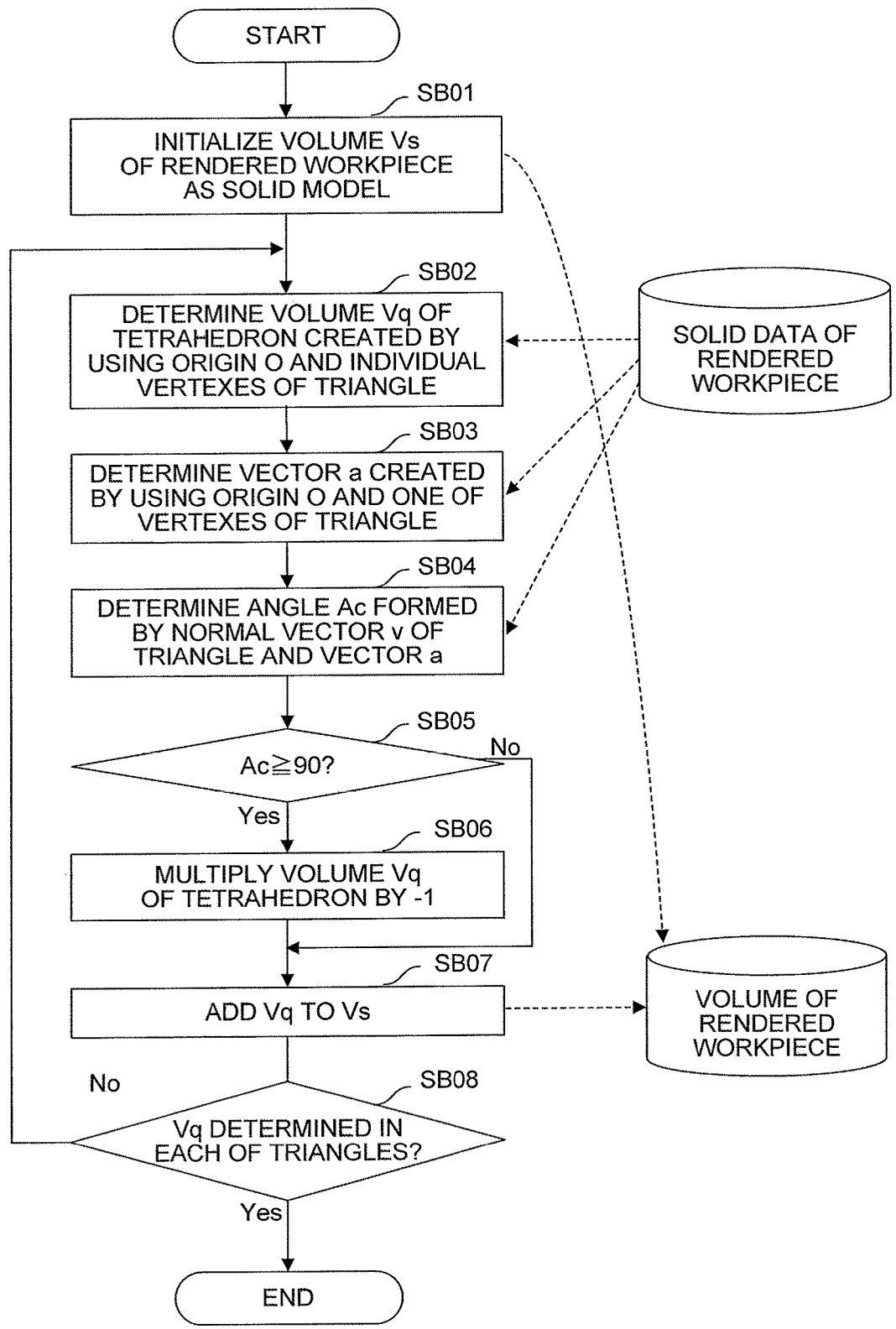
FIG. 9 is a flowchart of processes that determine a volume Vs of the workpiece as a rendered workpiece solid model executed by a rendered workpiece volume calculation unit.

FIG. 9 is a flowchart of processes for determining a volume Vs of the workpiece as a rendered workpiece solid model executed by the rendered workpiece volume calculation unit 101. Note that the present flowchart shows process procedures for determining the volume of the rendered workpiece constituted by the solid data of the type that satisfies the following conditions.

Condition 1: The surface of the workpiece is constituted by a plurality of minute triangular elements.

Condition 2: Data on the normal vector v of each triangle is calculated or acquired.

[Step SB01] The rendered workpiece volume calculation unit 101 initializes volume data of the rendered workpiece as the solid model when the calculation of the volume of the rendered workpiece as the solid model is started.

[Step SB02] The rendered workpiece volume calculation unit 101 determines the volume Vq of the tetrahedron created by using the origin O and the individual vertexes of the triangle constituting the shape of the rendered workpiece.

[Step SB03] The rendered workpiece volume calculation unit 101 determines the vector a created by using the origin O and a given vertex of the triangle constituting the shape of the rendered workpiece.

[Step SB04] The rendered workpiece volume calculation unit 101 determines the angle Ac formed by the normal vector v that is oriented to the outer side of the workpiece in the plane of the triangle and the vector a determined in Step SB03.

[Step S505] The rendered workpiece volume calculation unit 101 determines whether or not the angle Ac determined in Step SB04 is equal or more than 90°. The process flow moves to Step SB06 in the case where the angle Ac is equal or more than 90°, and the process flow moves to Step SB07 in the case where the angle Ac is less than 90°.

[Step SB06] The rendered workpiece volume calculation unit 101 multiplies the volume Vq of the tetrahedron determined in Step SB02 by −1.

[Step SB07] The rendered workpiece volume calculation unit 101 adds Vq determined in the above step to the volume Vs of the rendered workpiece as the solid model.

[Step SB08] The rendered workpiece volume calculation unit 101 determines whether or not the above processes are performed on all of the triangular elements constituting the rendered workpiece. The present processes are ended in the case where the processes are performed on all of the triangular elements, and the process flow moves to Step SB02 in the case where the processes are not performed on all of the triangular elements.

The embodiment of the present invention has been described thus far, and the present invention is not limited only to the examples of the embodiment described above, and can be carried out in various forms by making appropriate changes.

For example, the above embodiment has described the example in which the functions provided by the present invention are provided in the numerical controller, but the functions provided by the present invention may also be provided in a simulation device of the machining program installed in a personal computer or the like, and the individual functions of the present invention operate preferably also in this case.

In addition, the above embodiment has described the example in which the model of the rendered workpiece is the solid model having a surface constituted by the minute triangles, but any modeling method may be used as long as the model represents the three-dimensional shape that allows the calculation of the volume of the rendered workpiece.

Further, the above embodiment has described the device that removes the swarf by jetting the cutting fluid as the example of the means for discharging the swarf, but a magnet conveyer that extracts and transfers the swarf by using a magnet or a robot that holds a device that sucks the swarf may also be used as the means for discharging the swarf, and the swarf discharge command insertion unit 140 inserts the command for causing the means for removing the swarf to operate into the machining program at the timing of the swarf discharge calculated by the swarf discharge timing calculation unit 120 (the block number of the block in which the swarf accumulation amount exceeds the threshold value Th and the position of the tool when the swarf accumulation amount exceeds the threshold value Th in the block), whereby the above case can be handled.

The embodiment of the present invention has been described thus far, and the present invention is not limited to the examples of the embodiment described above, and can be carried out in other forms by making appropriate changes.

The invention claimed is:

1. A numerical controller comprising a simulation unit that executes a simulation in which a workpiece is machined based on a machining program, the numerical controller comprising:

a rendered workpiece volume calculation unit that calculates a volume of a rendered workpiece representing a shape of the workpiece that is rendered by the simulation; and a swarf accumulation amount prediction unit that predicts, based on the volume of an initial rendered workpiece when execution of the simulation is started and the volume of the rendered workpiece when execution of each block included in the machining program is completed that are calculated by the rendered workpiece volume calculation unit, a swarf accumulation amount when the execution of the block is completed;

a swarf discharge timing calculation unit that calculates a timing at which swarf is discharged based on the swarf accumulation amount when the execution of each block included in the machining program is completed that is predicted by the swarf accumulation amount prediction unit; and a swarf discharge command insertion unit that inserts a command code for swarf discharge into the machining program based on the timing at which the swarf is discharged that is calculated by the swarf discharge timing calculation unit.

2. The numerical controller according to claim 1, further comprising:
a coefficient database that stores a coefficient that is used when the swarf accumulation amount is calculated from a difference between the volume of the initial rendered workpiece when the execution of the simulation is started and the volume of the rendered workpiece when the execution of the block included in the machining program is completed, wherein
the swarf accumulation amount prediction unit predicts the swarf accumulation amount by multiplying, by the coefficient, the difference between the volume of the initial rendered workpiece when the execution of the simulation is started and the volume of the rendered workpiece when the execution of the block included in the machining program is completed.

3. The numerical controller according to claim 2, wherein at least one of a workpiece material coefficient associated with a material of the workpiece and a tool type coefficient associated with a type of a tool used in the machining is stored in the coefficient database.

4. The numerical controller according to claim 1, further comprising:
a display unit that displays the timing at which the swarf is discharged that is calculated by the swarf discharge timing calculation unit.

5. The numerical controller according to claim 1, wherein a display unit displays, in association with each block of the machining program, the swarf accumulation amount when execution of the block is completed.

* * * * *